(12) United States Patent
Awakura

(10) Patent No.: US 6,599,375 B1
(45) Date of Patent: Jul. 29, 2003

(54) COMPOSITE MAGNETIC BODY, AND ELECTROMAGNETIC INTERFERENCE SUPPRESSING BODY USING THE SAME

(75) Inventor: Yoshio Awakura, Yokohama (JP)

(73) Assignee: NEC Tokin Corporation, Sendai (JP)

(*) Notice: Subject to any disclaimer, the term of this patent is extended or adjusted under 35 U.S.C. 154(b) by 0 days.

(21) Appl. No.: 09/857,999

(22) PCT Filed: Oct. 18, 2000

(86) PCT No.: PCT/JP00/07208

§ 371 (c)(1),
(2), (4) Date: Jun. 13, 2001

(87) PCT Pub. No.: WO01/29850

PCT Pub. Date: Apr. 26, 2001

(30) Foreign Application Priority Data

Oct. 18, 1999 (JP) .......................................... 11-295581

(51) Int. Cl.⁷ .............................. H01F 1/12; H01F 1/28
(52) U.S. Cl. .................. 148/300; 148/309; 148/310; 148/311; 252/62.54
(58) Field of Search ................ 148/300, 306, 148/307, 310, 311, 312, 313; 252/62.53, 62.54, 62.55

(56) References Cited

U.S. PATENT DOCUMENTS

| | | | |
|---|---|---|---|
| 4,455,167 A | 6/1984 | Osborn | |
| 4,474,685 A | * 10/1984 | Annis | .................. 252/503 |
| 4,731,191 A | 3/1988 | Swihart | |
| 5,498,644 A | 3/1996 | Reo | |
| 6,284,363 B1 | 9/2001 | Maeda et al. | |
| 6,375,703 B1 | * 4/2002 | Chou et al. | .................. 428/606 |
| 2001/0051673 A1 | 12/2001 | Suzuki et al. | |

FOREIGN PATENT DOCUMENTS

| | | |
|---|---|---|
| DE | 2 137 487 | 2/1973 |
| EP | 0854669 | 7/1998 |
| EP | 0871183 | 10/1998 |
| JP | 07-207160 A | 8/1995 |
| JP | 10-92623 | 4/1998 |
| JP | 2000-101284 A | 4/2000 |
| JP | 2000-174480 A | 6/2000 |
| JP | 2001-044687 A | 2/2001 |
| WO | WO 89/04540 | 5/1989 |
| WO | WO 01/29851 A1 | 4/2001 |

* cited by examiner

Primary Examiner—John Sheehan
(74) Attorney, Agent, or Firm—Frishauf, Holtz, Goodman & Chick, P.C.

(57) ABSTRACT

A composite magnetic body 1, comprising a soft magnetic powder (2) and a binding agent (3), in which the specific surface area of the soft magnetic powder (2) is 0.1–3 m²/g. The surface state of the soft magnetic powder contained in the composite magnetic body is defined in terms of specific surface area, and self-extinguishing properties, i.e. fire resistance properties, are obtained. An electromagnetic interference suppressing body is obtained using this composite magnetic body.

20 Claims, 1 Drawing Sheet

COMPOSITE MAGNETIC BODY, AND ELECTROMAGNETIC INTERFERENCE SUPPRESSING BODY USING THE SAME

This application is a U.S. National Phase Application under 35 USC 371 of International Application PCT/JP00/07208 (published in English) filed Oct. 18, 2000.

TECHNICAL FIELD

The present invention relates to a composite magnetic body used to suppress electromagnetic interference brought about by interference from unwanted electromagnetic waves in a high-frequency band, and to an electromagnetic interference suppressing body obtained by the use thereof; and more particularly to a fireproofing technique for a composite magnetic body.

BACKGROUND ART

Cellular phones, personal computers, and other types of electronic equipment operated at high frequencies such as quasi-microwave band have become more widespread in recent years. In particular, smaller and lighter devices are urgently needed, with electromagnetic noise/interference posing a serious problem. In view of this, composite magnetic bodies and electromagnetic interference suppressing bodies are being commercialized as a means of countering such high-frequency electromagnetic interference.

Conventional composite magnetic bodies and electromagnetic interference suppressing bodies are disadvantageous, however, in that when a soft magnetic powder (particularly a soft magnetic alloy powder) and a binding agent are mixed together, flammability is promoted beyond the level possessed by the binding agent as such due to increased thermal conductivity or the catalytic action of the soft magnetic powder, making it extremely difficult to achieve self-extinguishing, which is the main element of fire resistance.

In view of this, the grain size of soft magnetic powder is normalized and soft magnetic powder is controlled to have a uniform grain size in conventional practice in order to achieve fire resistance characteristics of the composite magnetic body containing the soft magnetic powder.

However, the grain size of a powder merely indicates its dimensions and fails to unambiguously define the surface state of the powder (which determines aforementioned catalytic action or thermal conductivity), that is, the surface area in contact with air and other media.

In addition, fire resistance changes if the powder has a different grain size distribution.

In view of the above, it is an object of the present invention to provide a composite magnetic body containing a soft magnetic powder having a surface state defined in terms of specific surface area and thereby possessing the desired level of self-extinguishing, which is the main element of fire resistance.

It is another object of the present invention to provide an electromagnetic interference suppressing body by making use of the aforementioned composite magnetic body.

DISCLOSURE OF THE INVENTION

The inventor conducted thoroughgoing research into the relation between powder properties and fire resistance and discovered that the specific surface area of a soft magnetic powder has a marked effect on fire resistance. Specifically, the present invention, which is aimed at attaining the stated objects, entails using a soft magnetic powder normalized by the specific surface area and adding a fire retardant to a binding agent while taking into account the particle shape of the powder to fireproof the composite magnetic body and electromagnetic interference suppressing body.

According to an aspect of the present invention, there is provided a composite magnetic body comprising a soft magnetic powder and a binding agent, wherein the soft magnetic powder has a specific surface area of 0.1–3 $m^2/g$.

According to another aspect of the present invention, there is provided an electromagnetic interface suppressing body for suppressing electromagnetic interference brought about by interference from unwanted electromagnetic waves by use of a composite magnetic body comprising a soft magnetic powder and a binding agent, wherein the soft magnetic powder has a specific surface area of 0.1–3 $m^2/g$.

BEST MODE FOR EMBODYING THE INVENTION

Embodiments of the present invention will now be described with reference to drawings.

Figure 1:
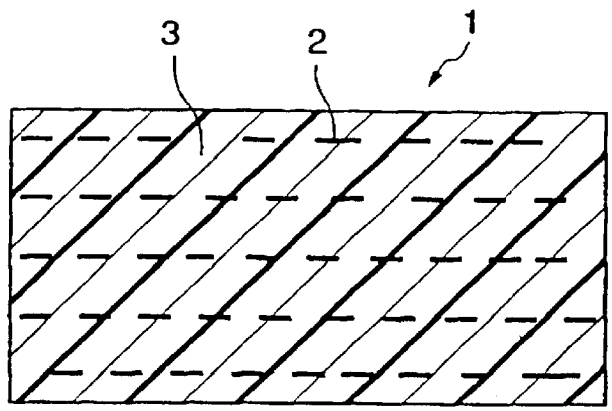
FIG. 1 is a cross-sectional view depicting the structure of a composite magnetic body according to an embodiment of the present invention.

Referring to FIG. 1, a composite magnetic body 1 is obtained using a binding agent 3 to bond together a flat soft magnetic powder 2 having a specific surface area of 0.1–3 $m^2/g$. The soft magnetic powder 2 is contained in the binding agent in a single planar orientation.

This composite magnetic body functions as an electromagnetic interference suppressing body for suppressing electromagnetic interference brought about by interference from unwanted electromagnetic waves when this composite magnetic body is used for the internal or peripheral portions of electrical devices.

Consequently, the composite magnetic body of the present embodiment will be regarded as the below-described composition obtained by the method described below, and will be referred to as an electromagnetic interference suppressing body when the composite magnetic body thus obtained is used for the internal or peripheral portions of electrical devices.

Specifically, the composite magnetic body and electromagnetic interference suppressing body will be referred to differently because these bodies are identical in terms of constituent components and manufacturing steps but are different in terms of application.

In the description that follows, this fact is emphasized by employing different terms for the above-described reasons whenever a composite magnetic body or an electromagnetic interference suppressing body is mentioned.

EXAMPLE 1

The mixing composition of the composite magnetic body according to the present invention is shown as Inventive Example 1 in Table 1 below. According to this example, a soft magnetic powder was obtained using an Fe—Si—Al alloy, which was a magnetic alloy powder having a flat shape. A composition based on Fe—Si—Al—Ni or the like could also be used as such a magnetic alloy powder.

The present Example 1 of the present invention used a composition comprising 6–11 wt % Si and 4–7 wt % Al, with Fe constituting the balance. This soft magnetic alloy powder had a specific surface area of 1.5 m$^2$/g, a mean grain size of 32 μm, and an aspect ratio of 3 or greater. 385 weight parts of the soft magnetic powder and 4 weight parts of titanate-based coupling agent were mixed together with the aid of a mixer or the like, and a preliminary surface treatment was performed. In the process, a surface treatment agent could be diluted with a diluent or the like to achieve uniform surface treatment.

An aluminate- or silane-based coupling agent could also be used as the coupling agent.

Isopropylated triaryl phosphate, which is a phosphoric acid ester compound acting as a phosphorus-containing fire retardant and doubling as a plasticizer, was further admixed and dispersed in an amount of 20 weight parts together with the coupled soft magnetic powder by means of a mixer or the like. This operation could also be performed simultaneously with the coupling treatment. A phosphoric acid ester compound such as tricresyl phosphate or cresyl diphenyl phosphate could also be used as the phosphorus-based fire retardant.

TABLE 1

| Mixing Composition | Example 1 Amount (weight parts) | Conventional Example Amount (weight parts) |
| --- | --- | --- |
| Binding Agent (halogen-containing) chlorinated polyethylene | 100 | 100 |
| Soft Magnetic Powder Fe—Si—Al alloy | | |
| Specific Surface Area 1.5 (m$^2$/g) | 385 | |
| Specific Surface Area 3.5 (m$^2$/g) | | 385 |
| Titanate-based Coupling Agent | 4 | 4 |
| Fire Retardant phosphoric acid ester compound | 20 | 20 |
| Fire Retardant magnesium hydroxide | 20 | 20 |
| Fire Retardant bromine-based polymer | 18 | 18 |
| Fire Retardant Aid antimony trioxide | 18 | 18 |

A kneaded magnetic material was subsequently obtained using a kneader to knead 100 weight parts of chlorinated polyethylene (halogen-containing binding agent), a total of 409 weight parts of a soft magnetic powder surface-treated with the coupling agent and dispersion-treated with the phosphorus-based fire retardant, 20 weight parts of magnesium hydroxide (fire retardant), 18 weight parts of bromine-based polymer fire retardant, and 18 weight parts of antimony trioxide, which functioned as a fire retardant aid for the bromine-based fire retardant. An intensive mixer or mixing rolls used for kneading purposes could also be employed as the aforementioned kneader.

Magnesium hydroxide, a bromine-based polymer fire retardant, and antimony trioxide (fire retardant aid) could also be mixed and used to perform a surface treatment during the aforementioned coupling treatment in order to improve the dispersibility of the kneaded magnetic material or to facilitate the handling of mixed members. Magnesium hydroxide (fire retardant) could also be replaced with aluminum hydroxide, and substantially the same effect can be obtained with a mixture of magnesium hydroxide and aluminum hydroxide.

The resulting kneaded magnetic material was subsequently rolled between rolls arranged in parallel, yielding a composite magnetic body in the form of a sheet. An extruder could be used in addition to such rolls in order to obtain a sheeted composite. Press molding or injection molding could also be used.

The composite magnetic body manufactured by the above-described method can be made to function as an electromagnetic interference suppressing body for suppressing electromagnetic interference brought about by interference from unwanted electromagnetic waves by being used for the internal and peripheral portions of electrical devices.

Results of Burning Tests involving Example 1 and a conventional example will now be described with reference to Table 2 below. The conventional example involved using a soft magnetic powder having a flat shape, a specific surface area of 3.5 m$^2$/g, and the same Fe—Si—Al alloy composition as in Example 1. Because composite magnetic bodies are often used for electronic components, the burning tests involved performing the below-described Vertical Burning Test UL 94V in accordance with the UL safety standards for the combustibility testing of plastic materials for equipment parts. The samples had a length of 127 mm, a width of 12.7 mm, and a thickness of 0.5 mm. The vertical burning tests were conducted using sample Nos. 1–5 (a total of five test pieces). The column titled "First Lingering Flame" shows the combustion time (in seconds) elapsed following a first flame contact, the column titled "Second Lingering Flame" shows the combustion time elapsed following a second flame contact, and the column titled "Second Lingering Flame+Smoldering Material" shows the combined smoldering time and combustion time elapsed following the second flame contact. "Smoldering time" refers to the time elapsed after flame burning has stopped, or the time during which a material burns without flame in the absence of flame burning.

TABLE 2

| | No. | Thickness (mm) | First Lingering Flame | Second Lingering Flame | Second Lingering Flame + Smoldering Material | Class |
| --- | --- | --- | --- | --- | --- | --- |
| Example 1 | | | | | | |
| Specific Surface Area of Powder 1.5 (m$^2$/g) | 1 | 0.50 | 2 | 1 | 5 | V-0 satisfied |
| | 2 | 0.50 | 1 | 2 | 6 | |
| | 3 | 0.51 | 2 | 1 | 4 | |
| | 4 | 0.50 | 2 | 1 | 3 | |
| | 5 | 0.50 | 1 | 2 | 5 | |
| Conventional Example | | | | | | |
| Specific Surface Area of Powder 3.5 (m$^2$/g) | 1 | 0.50 | 20 | 10 | 16 | failed |
| | 2 | 0.51 | 13 | NG | — | |
| | 3 | 0.50 | NG | — | — | |
| | 4 | 0.50 | 11 | NG | — | |
| | 5 | 0.50 | 9 | 30 | 38 | |

The conventional example failed to satisfy Combustion Standard UL 94. The samples caught fire when brought into contact with a flame, and the entire test pieces were incinerated in the case of sample Nos. 2,3, and 4. These results indicate that the conventional example is devoid of self-extinguishing properties and fails to meet the standard. By contrast, self-extinguishing properties were obtained in Example 1, and each test piece burned for 10 seconds or less following a first or second flame contact. In addition, the total time during which the flame lingered following all ten flame contacts was 15 seconds. This value is well below the standard value of no more than 50 seconds specified by this standard for Class V-0 materials. In addition, the total smoldering time and combustion time following second flame contact was 30 seconds or less for each of the test pieces. This result satisfies the Class V-0 requirement of the same standard and differs from the conventional example by providing self-extinguishing properties.

Following are results of Vertical Burning Test UL 94V involving composite magnetic bodies that differ from each other by the specific surface area of the soft magnetic powder. The composite magnetic bodies were manufactured in the same manner as in Example 1.

Figure 2:
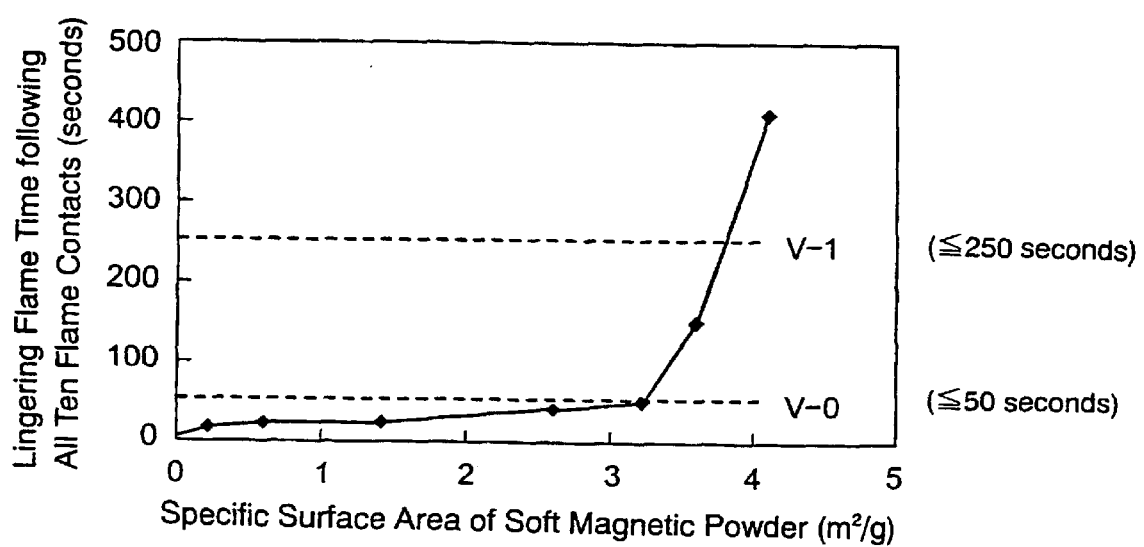
FIG. 2 is a diagram depicting the results of Vertical Burning Test UL 94V as a function of the specific surface area of the composite magnetic body according to the embodiment of the present invention.

FIG. 2 shows the results of Vertical Burning Test UL 94V concerning the specific surface area of a soft magnetic powder. The time in seconds indicates the combined lingering flame time (seconds) following a first flame contact and lingering flame time following a second flame contact (that is, the lingering flame time following all ten flame contacts) for each of the five test pieces Nos. 1–5. When the specific surface area is 0.1 $m^2/g$ or less, the lingering flame time following all ten flame contacts is about 10 seconds. The time is 17 seconds, 20 seconds, or 37 seconds when the surface area is 0.6 $m^2/g$, 1.4 $m^2/g$, or 2.6 $m^2/g$, respectively. The time is 48 seconds when the surface area exceeds 3 $m^2/g$ (when it is 3.2 $m^2/g$), and reaches 415 seconds when the surface area is 4.1 $m^2/g$. The results concerning the specific surface area of the soft magnetic powders and the fire resistance characteristics of the composite magnetic bodies indicate that the specific surface area thereof should be 3 $m^2/g$ or less (including the margin) in order to satisfy Class V-0 requirements of burning tests.

Whereas using materials with a specific surface area of 0.1 $m^2/g$ or less can still satisfy Class V-0 requirements of burning tests and yield the desired self-extinguishing properties, a narrower specific surface area has an adverse effect on magnetic characteristics and makes it impossible to obtain adequate electromagnetic interference suppression effects.

The same applies to a case in which the material used has the same Fe—Si—Al alloy composition as in Inventive Example 1 and possesses a specific surface area of less than 0.1 $m^2/g$. This material has the necessary self-extinguishing properties, but the aspect ratio falls below 3 with the reduction in powder flatness, magnetic characteristics deteriorate due to the shape/magnetic anisotropy of the powder, and the product cannot provide adequate electro-magnetic interference suppression effects as a composite magnetic body.

EXAMPLE 2

The mixing composition according to Example 2 is shown in Table 3. In this example, the same binding agent, soft magnetic powder, fire retardants (phosphoric acid ester compound and magnesium hydroxide), brominated polymer fire retardant, and fire retardant aid (antimony trioxide) as in Example 1 were mixed together to obtain a composite magnetic body.

The aforementioned soft magnetic powder (385 weight parts) and a primer (4 weight parts) whose SP (solubility parameter) value was less than the SP value of the soft magnetic powder but greater than the SP value of chlorinated polyethylene (binding agent) were first mixed together with the aid of a mixer or the like to perform a preliminary priming treatment on this soft magnetic powder. In the process, a primer could be diluted with a diluent or the like to achieve uniform surface treatment. The primer recommended by a coupling agent manufacturer was used in Inventive Example 2, but a dilute solution of, for example, polyvinyl chloride or polyvinylidene chloride could also be used.

TABLE 3

| Mixing Composition | Example 2 Amount (weight parts) | Conventional Example 1 Amount (weight parts) |
|---|---|---|
| Binding Agent (halogen-containing) chlorinated polyethylene | 100 | 100 |
| Soft Magnetic Powder Fe—Si—Al alloy | | |
| Specific Surface Area 1.5 ($m^2/g$) | 385 | |
| Specific Surface Area 3.5 ($m^2/g$) | | 385 |
| Primer having SP Value between SP Values of chlorinated polyethylene and Soft Magnetic Powder | 4 | 4 |
| Fire Retardant phosphoric acid ester compound | 20 | 20 |
| Fire Retardant magnesium hydroxide | 20 | 20 |
| Fire Retardant bromine-based polymer | 18 | 18 |
| Fire Retardant Aid antimony trioxide | 18 | 18 |

To facilitate comparison, the manufacturing method was performed under the same conditions as in Example 1. A mixture according to Comparative Example 1 is also shown in Table 3 as a comparison with Inventive Example 2. The powder used in Comparative Example 1 had a specific surface area of 3.5 $m^2/g$, which was 2 $m^2/g$ greater than the specific surface area (1.5 $m^2/g$) of the soft magnetic powder (Fe—Si—Al alloy powder) of Example 2. To facilitate comparison, the manufacturing method was performed under the same conditions as in Example 1.

The results of burning tests according to Example 2 and Comparative Example 1 are shown in Table 4 below.

TABLE 4

| | No. | Thickness (mm) | First Lingering Flame | Second Lingering Flame | Second Lingering Flame + Smoldering Material | Class |
|---|---|---|---|---|---|---|
| Example 2 | | | | | | |
| Specific Surface Area of Powder 1.5 ($m^2/g$) | 1 | 0.50 | 2 | 1 | 3 | V-0 satisfied |
| | 2 | 0.50 | 2 | 1 | 5 | |
| | 3 | 0.50 | 1 | 2 | 5 | |
| | 4 | 0.51 | 1 | 2 | 5 | |
| | 5 | 0.50 | 2 | 1 | 6 | |
| Comparative Example 2 | | | | | | |
| Specific Surface Area of Powder 3.5 ($m^2/g$) | 1 | 0.51 | NG | — | — | failed |
| | 2 | 0.51 | 14 | NG | — | |
| | 3 | 0.50 | 18 | 10 | 20 | |
| | 4 | 0.50 | 11 | 29 | 39 | |
| | 5 | 0.50 | 14 | NG | — | |

It can be seen in Table 4 that Comparative Example 1 fails to meet Fire Resistance Standard UL 94. There is no self-extinguishing. By contrast, Inventive Example 2 has self-extinguishing properties, and the combustion time elapsed following first and second flame contacts is 10 seconds or less for each test piece. In addition, the total lingering flame time elapsed following all ten flame contacts is 15 seconds, which meets the standard requirement of 50 seconds or less. The combined smoldering time and combustion time elapsed following the second flame contact is 30 seconds or less for each test piece. This meets the standard of 50 seconds or less for Class V-0 and provides the self-extinguishing properties absent in Comparative Example 1.

Self-extinguishing can be achieved with a material whose specific surface area is less than 0.1 $m^2/g$ and whose Fe—Si—Al alloy composition is the same as in Inventive Example 2, but because this value is low, magnetic characteristics deteriorate in the same manner due to the powder shape, and the product cannot provide adequate electromagnetic interference suppression effects as a composite magnetic body.

EXAMPLE 3

The mixing composition according to Example 3 is shown in Table 5. In this example, the same binding agent, coupling agent, fire retardants (phosphoric acid ester compound and magnesium hydroxide), brominated polymer fire retardant, and antimony trioxide as in Inventive Example 1 were mixed together to obtain a composite magnetic body. An Ni—Fe alloy (magnetic alloy powder) having a flat shape was used as the soft magnetic powder. The magnetic alloy powder was an Ni- and Fe-containing alloy powder. Cu, Mo, Cr, Mn, or the like could also be added in order to improve machinability or to obtain the desired electromagnetic interference suppression effect.

TABLE 5

| Mixing Composition | Example 3 Amount (weight parts) | Conventional Example 2 Amount (weight parts) |
| --- | --- | --- |
| Binding Agent (halogen-containing) chlorinated potyethylene | 100 | 100 |
| Soft Magnetic Powder Ni—Fe alloy | | |
| Specific Surface Area 1.5 ($m^2/g$) | 385 | |
| Specific Surface Area 3.5 ($m^2/g$) | | 385 |
| Titanate-based Coupling Agent | 4 | 4 |
| Fire Retardant phosphoric acid ester compound | 20 | 20 |
| Fire Retardant magnesium hydroxide | 20 | 20 |
| Fire Retardant bromine-based polymer | 18 | 18 |
| Fire Retardant Aid antimony trioxide | 18 | 18 |

To facilitate comparison, the manufacturing method was performed under the same conditions as in Example 1. The powder used in Comparative Example 2 had a specific surface area of 3.5 $m^2/g$, which was 2 $m^2/g$ greater than the specific surface area (1.5 $m^2/g$) of the soft magnetic powder (Ni—Fe alloy powder) of Example 3. To facilitate comparison, the manufacturing method was performed under the same conditions as in Example 1.

The results of burning tests according to Example 3 and Comparative Example 2 are shown in Table 6 below.

TABLE 6

| No. | Thickness (mm) | First Lingering Flame | Second Lingering Flame | Second Lingering Flame + Smoldering Material | Class |
| --- | --- | --- | --- | --- | --- |
| Example 2 | | | | | |
| Specific Surface Area of Powder 1.5 ($m^2/g$) | | | | | V-0 satisfied |
| 1 | 0.50 | 1 | 1 | 5 | |
| 2 | 0.50 | 1 | 1 | 5 | |
| 3 | 0.50 | 2 | 1 | 4 | |
| 4 | 0.51 | 2 | 1 | 4 | |
| 5 | 0.50 | 1 | 1 | 5 | |
| Comparative Example 2 | | | | | |
| Specific Surface Area of Powder 3.5 ($m^2/g$) | | | | | failed |
| 1 | 0.50 | 10 | NG | — | |
| 2 | 0.50 | NG | — | — | |
| 3 | 0.50 | 19 | 20 | 33 | |
| 4 | 0.50 | 20 | 25 | 36 | |
| 5 | 0.51 | NG | — | — | |

It can be seen from Table 6 that the comparative example fails to meet Fire Resistance Standard UL 94. There is no self-extinguishing. By contrast, Example 3 has self-extinguishing properties, and the combustion time elapsed following first and second flame contacts is 10 seconds or less for each test piece. In addition, the total lingering flame time elapsed following all ten flame contacts is 12 seconds, which meets the standard requirement of 50 seconds or less. The combined smoldering time and combustion time elapsed following the second flame contact is 30 seconds or less for each test piece. This meets the standard for Class V-0 and provides the self-extinguishing properties absent in Comparative Example 1.

Self-extinguishing can be achieved with a material whose specific surface area is less than 0.1 $m^2/g$ and whose Ni—Fe alloy composition is the same as in Example 3, but because this value is low, magnetic characteristics deteriorate in the same manner due to the powder shape, and the product cannot provide adequate electromagnetic interference suppression effects as a composite magnetic body.

As described above, using a powder with a specific surface area of 0.1–3 $m^2/g$ as the soft magnetic powder for a composite magnetic body in accordance with the present invention makes it possible to provide a composite magnetic body and an electromagnetic interference suppressing body having self-extinguishing properties, which is the main element of fire resistance.

In addition, a composite magnetic sheet based on the present invention corresponds to Class V-0 of Fire Resistance Standard UL 94.

Industrial Applicability

The composite magnetic body and electromagnetic interference suppressing body according to the present invention possess fire resistance and are therefore suitable for suppressing electromagnetic interference in cellular phones, personal computers, and other types of electronic equipment operated at high frequencies.

What is claimed is:

1. A composite magnetic body containing a soft magnetic powder and a binding agent, wherein the soft magnetic powder is a magnetic alloy powder having a specific surface area of 0.1–3 $m^2/g$.

2. A composite magnetic body as recited in claim 1, wherein said magnetic alloy powder has a flat shape.

3. A composite magnetic body containing a soft magnetic powder and a binding agent, wherein said soft magnetic powder has a specific surface area of 0.1–3 m$^2$/g and an aspect ratio of 3 or more.

4. A composite magnetic body as recited in claim 1, wherein said binding agent contains a halogen.

5. A composite magnetic body as recited in claim 1, further comprising a fire retardant, wherein said fire retardant contains at least one of a halogen, phosphorous, magnesium hydroxide, and aluminum hydroxide.

6. A composite magnetic body containing:
   a soft magnetic powder and a binding agent, wherein the soft magnetic powder has a specific surface area of 0.1–3 m$^2$/g,
   a fire retardant containing at least one of a halogen, phosphorous, magnesium hydroxide, aluminum hydroxide, and
   an antimony-containing oxide fire retardant aid.

7. A composite magnetic body as recited in claim 1, wherein said magnetic alloy powder is surface-treated with at least one coupling agent selected from titanate, aluminate, and silane.

8. A composite magnetic body as recited in claim 1, wherein said magnetic alloy powder is surface-treated with a primer having a solubility parameter value less than a solubility parameter value of the magnetic alloy powder but greater than a solubility parameter value of the binding agent.

9. A composite magnetic body as recited in claim 1, wherein said magnetic alloy powder contains at least Fe, Si, and Al.

10. A composite magnetic body as recited in claim 1, wherein said magnetic alloy powder contains at least Ni and Fe.

11. An electromagnetic interference suppressing body comprising a composite magnetic body containing a soft magnetic powder and a binding agent, wherein the soft magnetic powder is a magnetic alloy powder having a specific surface area of 0.1–3 m$^2$/g.

12. An electromagnetic interference suppressing body as recited in claim 11, wherein said magnetic alloy powder has a flat shape.

13. An electromagnetic interference suppressing body comprising a composite magnetic body containing a soft magnetic powder and a binding agent, wherein said soft magnetic powder has a specific surface area of 0.1–3 m$^{2/g}$ and an aspect ratio of 3 or more.

14. An electromagnetic interference suppressing body as recited in claim 11, wherein said binding agent contains a halogen.

15. An electromagnetic interference suppressing body as recited in claim 11, wherein said composite magnetic body further contains a fire retardant, said fire retardant containing at least one of a halogen, phosphorous, magnesium hydroxide, and aluminum hydroxide.

16. An electromagnetic interference suppressing body comprising a composite magnetic body containing:
    a soft magnetic powder and a binding agent, wherein the soft magnetic powder has a specific surface area of 0.1–3 m$^2$/g,
    a fire retardant containing at least one of a halogen, phosphorous, magnesium hydroxide, and aluminum hydroxide, and
    an antimony-containing oxide fire retardant aid.

17. An electromagnetic interference suppressing body as recited in claim 11, wherein said magnetic alloy power is surface-treated with at least one coupling agent selected from titanate, aluminate, and silane.

18. An electromagnetic interference suppressing body as recited in claim 11, wherein said magnetic alloy powder is surface-treated with a primer having a solubility parameter value less than a solubility parameter value of the magnetic alloy powder but greater than a solubility parameter value of the binding agent.

19. An electromagnetic interference suppressing body as recited in claim 11, wherein said magnetic alloy powder contains at least Fe, Si, and Al.

20. An electromagnetic interference suppressing body as recited in claim 11, wherein said magnetic alloy powder contains at least Ni and Fe.

* * * * *